(12) United States Patent
Ahn et al.

(10) Patent No.: US 7,927,996 B2
(45) Date of Patent: Apr. 19, 2011

(54) TUNGSTEN-DOPED INDIUM OXIDE STRUCTURES AND METHODS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 791 days.

(21) Appl. No.: 11/706,498

(22) Filed: Feb. 13, 2007

(65) Prior Publication Data
US 2008/0194094 A1    Aug. 14, 2008

(51) Int. Cl.
*H01L 21/441* (2006.01)
(52) U.S. Cl. ........ 438/609; 438/597; 438/608; 438/683; 438/685; 257/E21.161; 257/E21.168; 257/E21.476
(58) Field of Classification Search ............ 438/73, 438/99, 104, 597, 608, 609, 683, 685, E21.161, 438/168, 476; 257/E21.161
See application file for complete search history.

(56) References Cited

U.S. PATENT DOCUMENTS
6,241,911 B1 * 6/2001 Potter .................... 252/301.4 R
7,517,783 B2 * 4/2009 Ahn et al. .................... 438/608
2006/0246643 A1 * 11/2006 Ohsawa .................... 438/197

OTHER PUBLICATIONS

Asikainen, Timo , "Growth of indium-tin-oxide thin films by atomic layer epitaxy", *J. Electrochem. Soc.* Vol. 142, No. 10, (Oct. 1995),3538-3541.
Elam, J W., et al., "Viscous flow reactor with quartz crystal microbalance for thin film growth by atomic layer deposition", *Review of Scientific Instruments*, 73(8), (Aug. 2002),2981-87.
Ginley, David , et al., "Non-vacuum and PLD growth of next generation TCE materials", *Thin Solid Films*, 445, (2003),193-98.
Ginley, David S., "Transparent conducting oxides", *MRS Bulletin*, (Aug. 2000), 15-18.
Gordon, Roy G., "Criteria for choosing transparent conductors", www.mrs.org/publications/bulletin , (Aug. 2000),52-57.
Granqvist, C G., et al., "Transparent and conducting ITO films: new developments and applications", *Thin Solid Films*, 411, (2002),1-5.
Klaus, J W., "Atomic layer deposition of tungsten nitride films using sequential surface reactions", *Journal of the Electrochemical Society*, vol. 147, No. 3, (Mar. 2000),1175-1181.
Li, X , et al., "Development of novel tungsten-doped high mobility transparent conductive In2O3 thn films", *Journal of Vacuum Science and Technology*, A 24(5), Anne to get copy,(2006),1866-69.
Li, Xifeng , et al., "Preparation of molybdenum-doped indium oxide think films using reactive direct-current magnetron sputtering", *J. Matr. Res.*, 20(6), (Jun. 2005),1404-8.
Meng, Yang , "A new transparent conductive thin film $In_2O_3$:Mo", *Thin Slid Films 394*, (2001),219-223.
Meng, Yang , "Molybdemum-doped indium oxide transparent conductive thin films", *J. Vac. Sci. Technol. A 20*(1), (Jan./Feb. 2002),288-290.

(Continued)

*Primary Examiner* — Kiesha R Bryant
*Assistant Examiner* — Minchul Yang
(74) *Attorney, Agent, or Firm* — Schwegman, Lundberg & Woessner, P.A.

(57) ABSTRACT

Methods of forming transparent conducting oxides and devices formed by these methods are shown. Monolayers that contain tungsten and monolayers that contain indium are deposited onto a substrate and subsequently processed to form tungsten-doped indium oxide. The resulting transparent conducing oxide includes properties such as an amorphous or nanocrystalline microstructure. Devices that include transparent conducing oxides formed with these methods have better step coverage over substrate topography and more robust film mechanical properties.

18 Claims, 3 Drawing Sheets

OTHER PUBLICATIONS

Siokou, A , et al., "Effect of the tungsten and molybdenum oxidation states on the thermal coloration of amorphous $WO_3$ and $MoO_3$ films", *Surface Science 482-485*, (2001),294-299.

Sneh, Ofer , "Thin film atomic layer deposition equipment for semiconductor processing", *Thin Solid Films*, 402(1-2), (2002),248-261.

Warmsingh, C. , "High-mobility transparent conducting Mo-doped $In_2O_3$ thin films by pulsed laser deposition", *Journal of Applied Physics*, vol. 95, No. 7, (Apr. 1, 2004),3831-3833.

Yoshida, Yuki, "Development of radio-frequency magnetron sputtered indium molybdenum oxide", *J. Vac. Sci. Technol. A 21*(4), Jul./Aug. 2003), 1092-1097.

Yoshida, Yuki, et al., "High-mobility sputtered films of indium oxide doped with molybdenum", *Applied Physics Letters*, 84(12), (Mar. 2004),2097-99.

\* cited by examiner

US 7,927,996 B2

TUNGSTEN-DOPED INDIUM OXIDE STRUCTURES AND METHODS

TECHNICAL FIELD

This application relates generally to transparent conducting oxide materials, fabrication methods, and electronic devices in which such conducting oxides are used.

BACKGROUND

Transparent conducting oxides (TCOs) are extensively used in electronic applications where electrical conduction and optical transparency are both required. Some example applications include liquid crystal displays (LCDs) organic light emitting diodes (LEDs), solar cells, etc. Indium tin oxide (ITO) is widely used because of it's high transparency, low resistivity, and high work function. One drawback to ITO is limited chemical stability at higher temperatures. It is also desirable to further reduce electrical resistivity in TCOs.

Tungsten-doped indium oxide (IWO) materials are being explored as possible alternatives to TCOs such as ITO due to properties such as high transparency and high carrier mobility. However, IWO formation methods such as metal sputtering and subsequent oxidation do not provide films or other structures of the quality and cost necessary for some device applications.

What are needed are methods to form IWO films that produce improved IWO structures with improved properties such as transparency, resistivity, crystallinity, step coverage, mechanical properties, etc. What are also needed are improved IWO films, structures, etc. and devices utilizing these IWO oxides that take advantage of the improved properties.

DETAILED DESCRIPTION

In the following detailed description of the invention, reference is made to the accompanying drawings that form a part hereof and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "wafer" and "substrate" used in the following description include any structure having an exposed surface with which to form an electronic device or device component such as a component of an integrated circuit (IC). The term substrate is understood to include semiconductor wafers. The term substrate is also used to refer to semiconductor structures during processing and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors and the term insulator or dielectric is defined to include any material that is less electrically conductive than the materials referred to as conductors. The term transparent is defined as a property of a material that transmits a substantial portion of incident electromagnetic energy in a give frequency range. Examples of electromagnetic energy ranges include visible frequency light, infrared, ultraviolet, etc. or combinations of frequency ranges. The term monolayer is defined as a material layer that is substantially one molecule thick. In some embodiments, one molecule includes one atom, while other molecules are comprised of several atoms. The term monolayer is further defined to be substantially uniform in thickness, although slight variations of between approximately 0 to 2 monolayers results in an average of a single monolayer as used in description below.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Figure 1A:
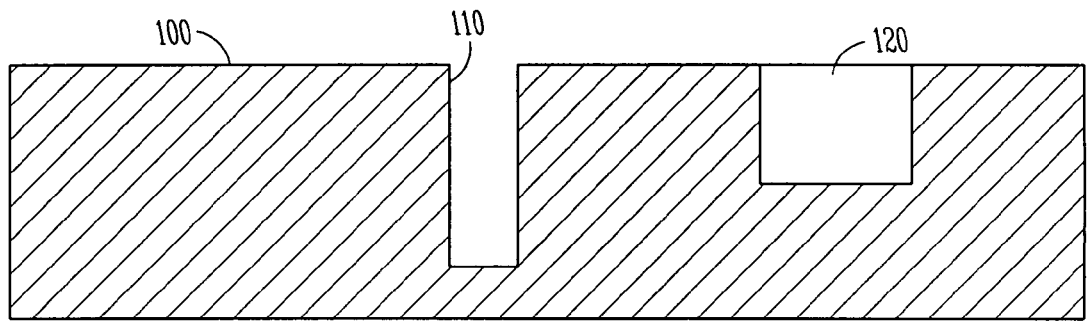
FIG. 1A shows a surface of an electronic device in a stage of processing according to an embodiment of the invention.

FIG. 1A shows a substrate surface 100 of an electrical device such as a semiconductor based device. The surface 100 includes variations in surface topography as illustrated by feature 110 such as a trench. Although a trench 110 is illustrated as an example, other variations in topography, both above and below an average surface level are useful to describe embodiments of the invention.

An electronic device 120 is also shown in a rough block diagram form in FIG. 1A. Examples of electronic devices 120 include optical electronic devices such as active pixel sensors, photovoltaic devices, light emitting diode (LED) devices, plasma display screen devices etc. Other devices that benefit from adjacent structures with optical transparency are within the scope of the invention.

Figure 1B:
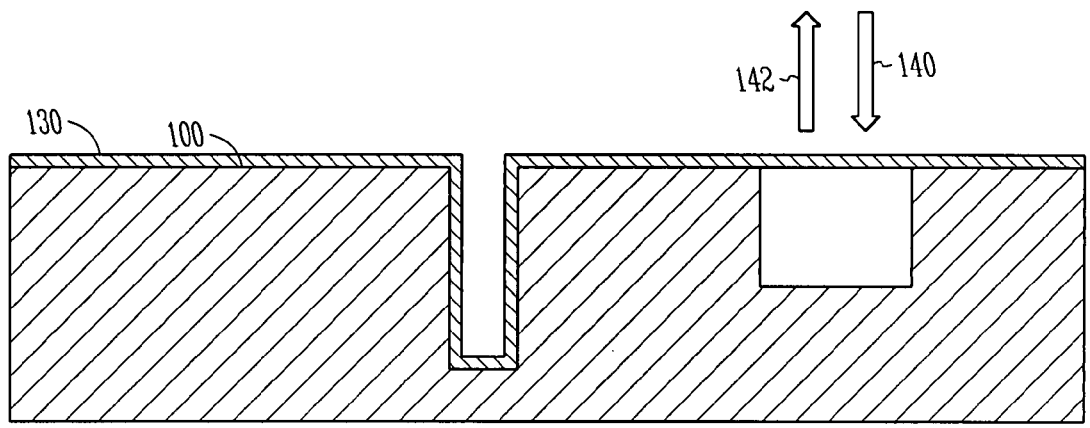
FIG. 1B shows a surface of an electronic device in another stage of processing according to an embodiment of the invention.

FIG. 1B shows a deposited transparent conducting oxide layer 130 including tungsten and indium formed over the surface 100. In one embodiment, the transparent conducting oxide layer 130 includes a tungsten-doped indium oxide (IWO) layer. As discussed above, tungsten-doped indium oxide provides a number of useful properties over other transparent conducting oxides such as indium tin oxide. Advantages include high transparency and low electrical resistivity. The layer 130 is shown forming a conformal layer over challenging topography such as feature 110. The layer 130 is also shown covering at least a portion of the electronic device 120.

FIG. 1B illustrates an incoming beam 140 of electromagnetic energy such as visible frequency light, UV light, etc. Selected devices within the scope of the invention include devices such as photovoltaic, active pixel sensors, etc. that benefit from the ability to receive the incoming beam through a transparent layer 130. FIG. 1B also illustrates an outgoing beam 142. Selected devices within the scope of the invention include likewise include devices such as light emitting diodes, plasma display screen emitters, etc. that benefit from the ability to transmit an outgoing beam through a transparent layer 130. One use of transparent conducting oxides in conjunction with devices such as these includes interconnection circuitry between devices, to an edge of an array or a chip, to a power supply, etc.

The transparent conducting oxide layer 130 is formed using monolayer deposition methods as described in embodiments below. Methods include atomic layer deposition (ALD) techniques, chemically self-limiting techniques, or other techniques that form monolayers with controlled thickness. As defined above, the term monolayer defines a layer that is substantially one molecule or one atom thick. Although substantially one layer thick, some variation on the order of 0 to 2 molecules is within the scope of the invention.

The methods described form a unique structure compared to other deposition methods. Using monolayer deposition methods described below, a transparent conducting oxide structure can be formed with step coverage over surface topography that is superior to other deposition techniques such as conventional CVD, sputtering, and laser ablation. Selected monolayer processing methods can provide a substantially amorphous transparent conducting oxide structure that is not possible using other deposition techniques. Other processing variations provide a fine crystal distribution such as a nanocrystalline transparent conducting oxide structure. Micro-scale and nano-scale crystal structures provide unique physical properties such as highly durable films.

Figure 2:
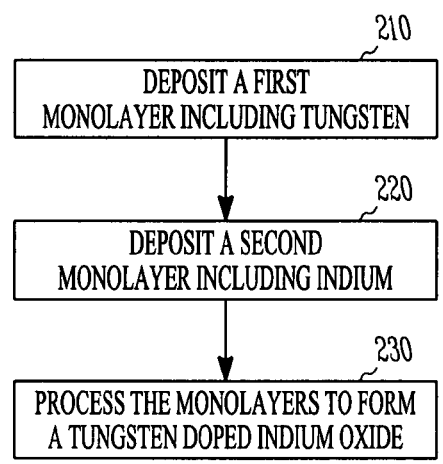
FIG. 2 shows a method of forming a material layer or structure according to an embodiment of the invention.

FIG. 2 shows a flow diagram of an example method of forming a transparent conducting oxide according to an embodiment of the invention. In operation 210, a monolayer that includes tungten is deposited. In one embodiment, the first monolayer is tungsten oxide. A primary example of tungsten oxide includes $WO_3$. In one embodiment, the first monolayer is tungsten nitride. One example of tungsten nitride includes $W_2N$. In one embodiment the monolayer is tungsten metal.

In operation 220, a monolayer that includes indium is deposited. In one embodiment, the second monolayer is indium oxide. A primary example of indium oxide includes $In_2O_3$. In one embodiment the monolayer is indium metal.

Several layers including tungsten containing layers and indium containing layers can be built up to form a laminate structure. More layers can be used to form thicker structures. Further, as discussed in more detail below, the relative number of each layer can be adjusted to provide any desired ratio between tungsten and indium. By using monolayer deposition, the thickness and/or the ratio between layer materials is precisely controlled. Although two layers including tungsten and indium are described, the invention is not so limited. Other layers are also included in selected embodiment to provide additional chemical and structural options.

In operation 230, the layers in the laminate are processed to form a transparent conducting oxide structure. Processing of laminate embodiments such as $W_2N/In_2O_3$ includes annealing or activating diffusion processes to mix the layers and provide a tungsten-doped indium oxide. Processing of metal layer embodiments such as W/In includes oxidizing the layers and mixing the layer to provide a tungsten-doped indium oxide. Final chemistry of the dopant and matrix will depend on the application of the transparent conducting oxide and any related electronic device.

Processing variable such as temperature and pressure, duration, etc. are chosen to tailor a desired structure morphology. For example, in one embodiment the individual layers in the laminate are deposited in a substantially amorphous state. By processing at a low temperature, the amorphous characteristics of the original layer is substantially preserved, and the resulting transparent conducting oxide is substantially amorphous. Likewise, other processing variables can also be chosen to produce a micro-crystalline or nano-crystalline transparent conducting oxide microstructure. As mentioned above, microstructures such as nano-crystallinity provide advantages such as improved film durability.

As discussed above, monolayer deposition of material layers provides a number of advantages for transparent conducting oxide structures. One method of depositing monolayers includes atomic layer deposition (ALD). ALD was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favorable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for applications such as planar substrates, deep trenches, and in material deposition on porous materials, other high surface area materials, powders, etc. Examples include, but are not limited to porous silicon, alumina powders, etc. Significantly, ALD provides for controlling deposition thickness in a straightforward, simple manner by controlling the number of growth cycles.

The precursors used in an ALD process may be gaseous, liquid or solid. Typically, liquid or solid precursors are volatile. The vapor pressure must be high enough for effective mass transportation. Also, solid and some liquid precursors are heated inside the reaction chamber and introduced through heated tubes to the substrates. The necessary vapor pressure is reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other considerations for precursors used in ALD. Thermal stability of precursors at the substrate temperature is a factor because precursor decomposition affects the surface control. ALD is heavily dependent on the reaction of the precursor at the substrate surface. A slight decomposition, if slow compared to the ALD growth, can be tolerated.

The precursors chemisorb on or react with the surface, though the interaction between the precursor and the surface as well as the mechanism for the adsorption is different for different precursors. The molecules at the substrate surface react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction are typically gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse or chamber evacuation to remove excess precursor and by-products from the reaction chamber prior to pulsing the next precursor of the fabrication sequence.

Using RS-ALD, films can be layered in equal metered sequences that are essentially identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

RS-ALD provides for high continuity at an interface compared with other techniques such as CVD; conformality over difficult topography on a substrate; use of low temperature and mildly oxidizing processes; growth thickness dependent solely on the number of cycles performed, and ability to engineer multilayer laminate films with resolution of one to two monolayers. RS-ALD allows for deposition control on the order on monolayers and the ability to deposit monolayers of amorphous films.

RS-ALD processes provide for robust deposition of films or other structures. Due to the unique self-limiting surface reaction materials that are deposited using RS-ALD, such films are free from processing challenges such as first wafer effects and chamber dependence. Accordingly, RS-ALD processes are easy to transfer from development to production and from 200 to 300 mm wafer sizes in production lines. Thickness depends solely on the number of cycles. Thickness can therefore be dialed in by controlling the number of cycles.

Laminate structures of multiple layers formed using ALD can also be subsequently processed to mix the individual layers together. For example, a laminate structure can be annealed to mix a plurality of different layers together, thus forming an alloy or a mixture of layer chemistries. By forming a laminate structure using ALD, and subsequently mixing the layers, the chemistry of the resulting structure is precisely controlled. Because the laminate is made up of self-limiting monolayers over a known surface area, the number of molecules from each individual layer are known to a high degree of accuracy. Chemistry can be controlled by adding or subtracting one or more layers in the laminate.

Figure 3:
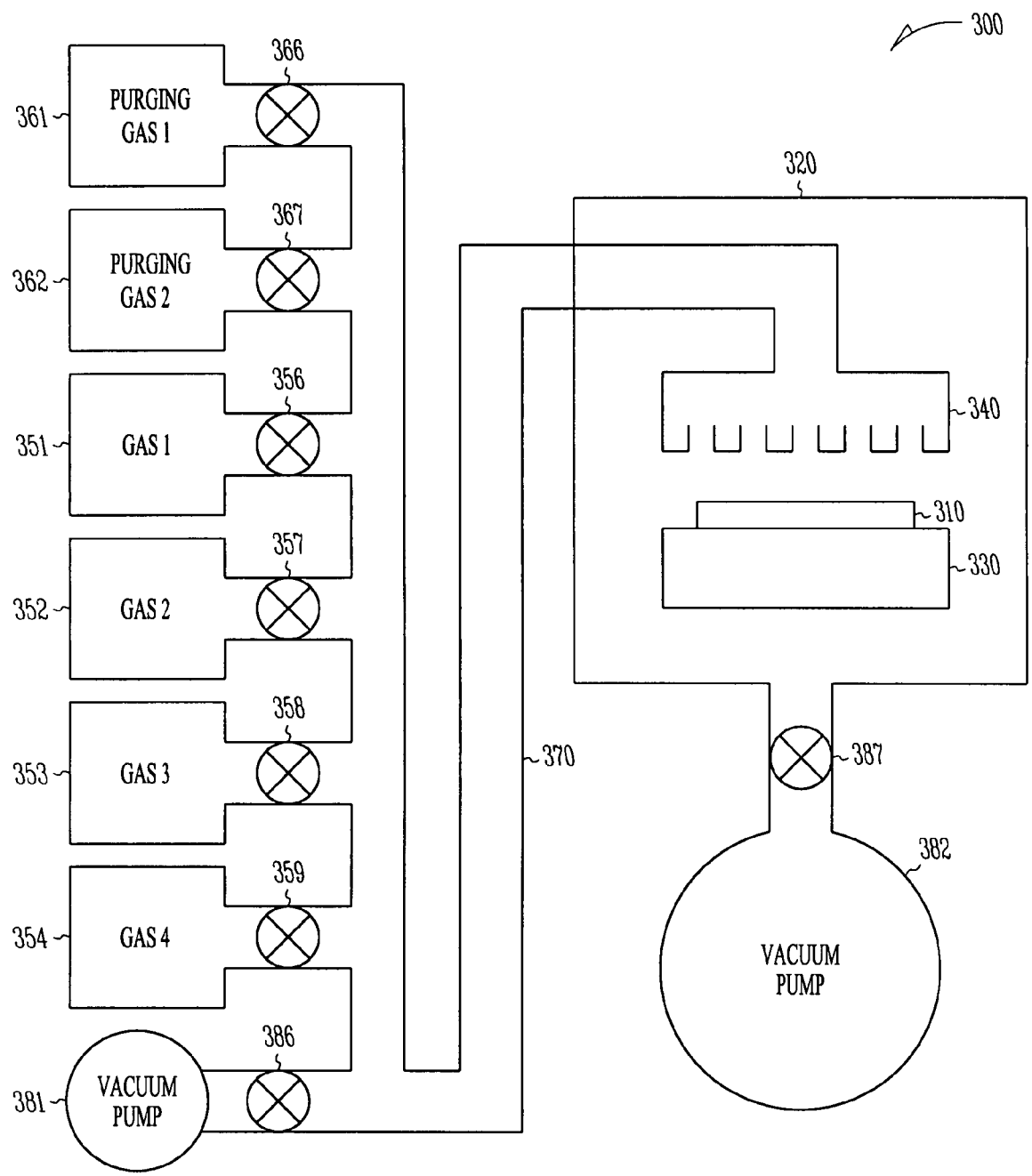
FIG. 3 shows a material deposition system according to an embodiment of the invention.

FIG. 3 shows an embodiment of an atomic layer deposition system for processing tungsten containing layers and indium containing layers according to the teachings of the present invention. The elements depicted are those elements necessary for discussion of the present invention such that those skilled in the art may practice the present invention without undue experimentation.

In FIG. 3, a substrate 310 is located inside a reaction chamber 320 of ALD system 300. Also located within the reaction chamber 320 is a heating element 330 which is thermally coupled to substrate 310 to control the substrate temperature. A gas-distribution fixture 340 introduces precursor gases to the substrate 310. Each precursor gas originates from individual gas sources 351-354 whose flow is controlled by mass-flow controllers 356-359, respectively. The gas sources 351-354 provide a precursor gas either by storing the precursor as a gas or by providing a location and apparatus for evaporating a solid or liquid material to form the selected precursor gas.

Also included in the ALD system 300 are purging gas sources 361, 362, each of which is coupled to mass-flow controllers 366, 367, respectively. The gas sources 351-354 and the purging gas sources 361-362 are coupled by their associated mass-flow controllers to a common gas line or conduit 370 which is coupled to the gas-distribution fixture 340 inside the reaction chamber 320. Gas conduit 370 is also coupled to vacuum pump, or exhaust pump, 381 by mass-flow controller 386 to remove excess precursor gases, purging gases, and by-product gases at the end of a purging sequence from the gas conduit 370.

Vacuum pump, or exhaust pump, 382 is coupled by mass-flow controller 387 to remove excess precursor gases, purging gases, and by-product gases at the end of a purging sequence from the reaction chamber 320. For convenience, control displays, mounting apparatus, temperature sensing devices, substrate maneuvering apparatus, and necessary electrical connections as are known to those skilled in the art are not shown in FIG. 3. Although ALD system 300 is illustrated as an example, other ALD systems may be used.

Using ALD methods as described above there are a number of different precursor chemistries that can be used to form monolayers including tungsten, and monolayers including indium. One example chemistry for tungsten nitride includes processing variations of the binary reaction $2WF_6 + NH_3 \rightarrow W_2N + 3HF + 9/2F_2$. In one example, self-limiting growth occurs at substrate temperatures ranging from 600 to 800 K. Another example chemistry for monolayers including tungsten is sequential exposure of $Si_2H_6$ and $WF_6$. at approximately 10 Torr.

One example of chemistry for indium oxide includes $InCl_2$ that is reacted with water. In one example, $InCl_2$ is oxidized at substrate temperatures between 400 and 500° C. In one embodiment, $In_2O_3$ films grown with $InCl_2$ and water are polycrystalline with a preferred grain orientation in the [100] direction.

Although examples of precursors, oxidizers, and process conditions are listed above, the invention is not so limited. One of ordinary skill in the art, having the benefit of the present disclosure will recognize that other chemistries and process conditions that form monolayers with tungsten and indium can be used.

Figure 4:
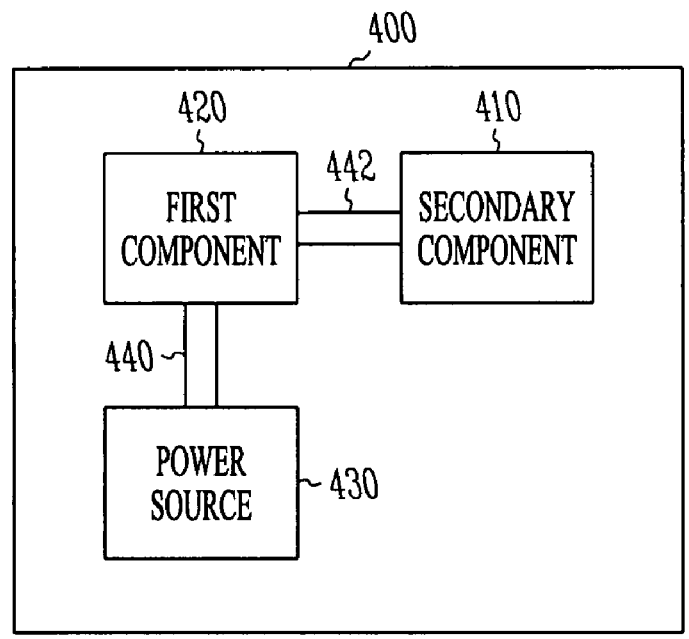
FIG. 4 shows a block diagram of an electronic device according to an embodiment of the invention.

FIG. 4 illustrates an electronic device 400 that includes transparent conducting oxide structures formed using monolayer deposition methods such as ALD as described above. The electronic device 400 includes a first component 420 that benefits from transparent conducting structures. Examples of first component 420 includes LEDs, active pixel sensors, solar cells, a liquid crystal display (LCD) region, a controlled visibility region of a smart window, gas sensors, electroluminescent (EL) devices etc. In these examples, device operation is improved with transparency to electromagnetic energy such as visible wavelength light, infrared light, ultra violet light, etc.

In one embodiment, the device 400 further includes a power source 430. The power source 430 is electrically connected to the first component 420 using interconnecting circuitry 440. In one embodiment, the interconnecting circuitry 440 includes tungsten-doped indium oxide formed as a transparent conducting oxide using methods described above. In addition to depositing material as described above, techniques such as lithography with masks, and/or etching etc. can be used to pattern conducting circuitry.

In one embodiment, the device 400 further includes a secondary component 410. The secondary component is electrically connected to the first component 420 using interconnecting circuitry 442. Likewise, in one embodiment, the interconnecting circuitry 442 includes tungsten-doped indium oxide formed as a transparent conducting oxide using methods described above. Examples of secondary components 410 include signal amplifiers, semiconductor memory, logic circuitry or other microprocessing circuits, etc. Aside from interconnecting circuitry, in one embodiment, the first component 420 and/or the secondary component 410 includes a tungsten-doped indium oxide structure formed as a transparent conducting oxide using methods described above.

Figure 5:
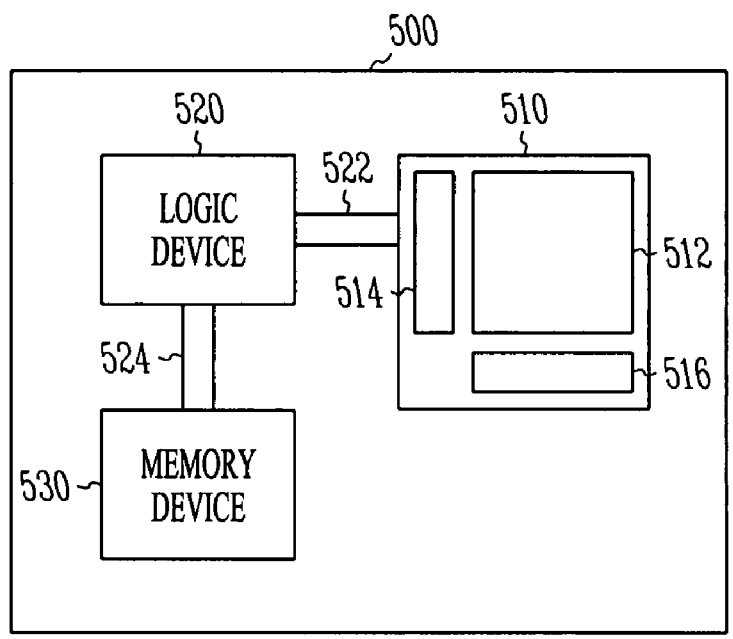
FIG. 5 shows a block diagram of an image sensor according to an embodiment of the invention.

FIG. 5 shows one specific example of an electronic device including transparent conducting oxides formed as described above. An imaging device 500 is shown. The imaging device includes an image sensor 510, with a pixel array 512. In one embodiment the pixel array 512 is coupled to additional row circuitry 514 and column circuitry 516. Examples of row and/or column circuitry includes drivers, amplifiers, decoders, etc. In one embodiment, the image sensor 510 is formed on a single semiconductor substrate using CMOS processes.

FIG. 5 further shows a logic device 520 coupled to the image sensor 510 through circuitry 522. In one embodiment, the logic device 520 includes a programmable logic circuit. Other logic devices include microprocessors, etc. In one embodiment, the logic device 520 and circuitry 522 are formed on the same semiconductor substrate as the image sensor 510.

A memory device 530 is also shown in FIG. 5. In one embodiment, the memory device is coupled to the logic device 520 using circuitry 524. In one embodiment, the memory device 530, the logic device 520 and circuitry 522, 524 are formed on the same semiconductor substrate as the image sensor 510. An advantage of CMOS processing includes the ability to form a variety of different devices, such as logic, memory, and image sensing on a single substrate. Using monolayer deposition processes as described above, tungsten-doped indium oxide conductors can further be formed on a single substrate using CMOS processing equipment.

As shown, example applications of transparent conducting oxides include circuitry 522, 524 and circuitry within the image sensor 510. Although interconnecting circuitry applications for transparent conducting oxides are discussed, the invention is not so limited. Other regions and structures of semiconductor chips where properties such as transparency and conductivity are important are within the scope of the invention.

While a number of improved features of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon reviewing the above description. The scope of the invention includes any other applications in which the above structures and methods are used. The scope of the invention should be determined with reference to the appended claims, along with the full scope of equivalents to which such claims are entitled.

What is claimed is:

1. A method of forming a transparent conducting oxide component, comprising:
    forming a plurality of monolayers on a substrate, including:
        depositing a tungsten nitride monolayer;
        depositing a second monolayer including indium;
    processing the plurality of monolayers to form a tungsten-doped indium oxide, wherein processing includes;
    annealing the plurality of monolayers to form a substantially uniform chemical mixture of the monolayers.

2. The method of claim 1, wherein depositing at least a first monolayer including tungsten includes depositing a tungsten oxide monolayer.

3. The method of claim 1, wherein depositing at least a second monolayer including indium includes depositing an indium oxide monolayer.

4. The method of claim 1, wherein processing the plurality of monolayers includes oxidizing metallic monolayers to form a tungsten-doped indium oxide.

5. The method of claim 1, wherein processing the plurality of monolayers includes processing substantially amorphous monolayers at a temperature that forms a substantially amorphous tungsten-doped indium oxide.

6. The method of claim 1, wherein processing the plurality of monolayers includes processing the monolayers at a temperature that forms a substantially nanocrystalline tungsten-doped indium oxide.

7. A method of forming an image sensor, comprising:
    forming an array of active pixel sensors on a substrate;
    forming a number of signal amplifiers coupled to pixel sensors in the array;
    forming a tungsten-doped indium oxide transparent conducting oxide structure coupled to the active pixel sensors and the signal amplifiers, including:
        forming a plurality of chemically self-limiting monolayers connected between the active pixel sensors and the signal amplifiers, including:
            depositing at least a first monolayer including tungsten;
            depositing at least a second monolayer including indium; and
        annealing the plurality of chemically self-limiting monolayers to form a substantially uniform chemical mixture of the monolayers.

8. The method of claim 7, wherein the image sensor is formed using only complementary metal oxide semiconductor (CMOS) processing techniques.

9. The method of claim 8, further including forming programmable logic circuitry on the same substrate as the array of active pixel sensors.

10. The method of claim 9, further including forming a memory array on the same substrate as the array of active pixel sensors.

11. The method of claim 7, wherein depositing at least a first monolayer including tungsten includes depositing a $W_2N$ monolayer.

12. The method of claim 7, wherein depositing at least a second monolayer including indium includes depositing a $In_2O_3$ monolayer.

13. A method of forming an electrical device, comprising:
    forming a first electrical component on a substrate;
    forming a second electrical component electrically separate from the first electrical component;

forming a tungsten-doped indium oxide transparent conducting oxide structure electrically connecting the first electrical component and the second electrical component, including:
   forming a plurality of monolayers, at least two of which have different chemistries, including:
      depositing at least a first monolayer including tungsten;
      depositing at least a second monolayer including indium; and
   annealing the plurality of monolayers to form a chemical mixture of the monolayers.

14. The method of claim 13, wherein depositing at least a first monolayer including tungsten includes atomic layer deposition (ALD) of a $W_2N$ monolayer.

15. The method of claim 14, wherein atomic layer deposition (ALD) of a $W_2N$ monolayer includes exposing a $WF_6$ layer to $NH_3$.

16. The method of claim 13, wherein depositing at least a first monolayer including tungsten includes sequential exposure of $Si_2H_6$ and $WF_6$.

17. The method of claim 13, wherein depositing at least a second monolayer including indium includes atomic layer deposition (ALD) of an $In_2O_3$ monolayer.

18. The method of claim 17, wherein atomic layer deposition (ALD) of a $In_2O_3$ monolayer includes oxidizing $InCl_2$.

* * * * *